(12) United States Patent
Yudovsky

(10) Patent No.: US 6,544,340 B2
(45) Date of Patent: Apr. 8, 2003

(54) HEATER WITH DETACHABLE CERAMIC TOP PLATE

(75) Inventor: Joseph Yudovsky, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 102 days.

(21) Appl. No.: 09/733,374

(22) Filed: Dec. 8, 2000

(65) Prior Publication Data

US 2002/0069820 A1 Jun. 13, 2002

(51) Int. Cl.[7] .......................... H01L 21/00; C23C 16/00
(52) U.S. Cl. .................. 118/728; 118/725; 118/729; 118/715; 156/345.51; 156/345.52
(58) Field of Search ................. 118/715, 725, 118/728, 729, 730, 500

(56) References Cited

U.S. PATENT DOCUMENTS

| | | | |
|---|---|---|---|
| 5,560,780 A | | 10/1996 | Wu et al. ..................... 118/728 |
| 5,985,033 A | * | 11/1999 | Yudovsky et al. .......... 118/500 |
| 6,053,982 A | * | 4/2000 | Halpin et al. ............... 118/500 |
| 6,096,135 A | * | 8/2000 | Guo et al. ................... 118/715 |
| 6,113,704 A | * | 9/2000 | Satoh et al. ................. 118/724 |
| 6,328,096 B1 | * | 12/2001 | Stone et al. ................. 118/728 |
| 6,342,691 B1 | * | 1/2002 | Johnsgard et al. .......... 118/50.1 |

FOREIGN PATENT DOCUMENTS

EP 0 732 728 A2 9/1996 ............ H01J/37/32

OTHER PUBLICATIONS

Stimson "Apparatus for Improved Power Coupling Through a Workpiece in a Semiconductor Wafer Processing System" U.S. patent application No. 09/182,023, filed Oct. 29, 1998.
Lei et al. "Ceramic Substrate Support" U.S. patent application No. 09/596,854, filed Jun. 19, 2000.

* cited by examiner

Primary Examiner—Gregory Mills
Assistant Examiner—Ram N Kackar
(74) Attorney, Agent, or Firm—Moser Patterson Sheridan LLP.

(57) ABSTRACT

A substrate support assembly for supporting a substrate during processing is provided. In one embodiment, a support assembly includes a support plate supported by a second plate. The support plate has a first side and a second side. The second side of the support has a recess formed therein. The second plate includes a boss extending from the second plate which mates with the recess of the support plate. Other embodiments include a flange that extends from the support plate that supports a shadow ring and a plurality of sleeves extending from the support plate for guiding lift pins.

42 Claims, 8 Drawing Sheets

HEATER WITH DETACHABLE CERAMIC TOP PLATE

This application is related to U.S. patent application Ser. No. 09/596,854, filed Jun. 19, 2000, entitled "CERAMIC SUBSTRATE SUPPORT", which is incorporated by reference herein in its entirety.

BACKGROUND OF THE DISCLOSURE

1. Field of Invention

The invention relates generally to an apparatus for supporting a substrate in a semiconductor processing chamber.

2. Background of the Invention

Integrated circuits have evolved into complex devices that can include millions of transistors, capacitors and resistors on a single chip. The evolution of chip designs continually requires faster circuitry and greater circuit density that demand increasingly precise fabrication processes. One fabrication process frequently used is chemical vapor deposition (CVD).

Chemical vapor deposition is generally employed to deposit a thin film on a substrate, such as a semiconductor wafer. Chemical vapor deposition is generally accomplished by introducing a precursor gas in to a vacuum chamber. The precursor gas is typically directed through a showerhead situated near the top of the chamber. The precursor gas reacts to form a layer of material on a surface of the substrate that is positioned on a heated substrate support. Purge gas is routed through holes in the support to the edge of the substrate to prevent deposition at the substrate's edge that may cause the substrate to adhere to the support or flake off during processing. Volatile by-products produced during the reaction are pumped from the chamber through an exhaust system.

One material frequently formed on substrates using a chemical vapor deposition process is tungsten. A precursor gas that may be used to form tungsten generally includes tungsten hexafluoride ($WF_6$) and silane. As the silane and tungsten hexafluoride mix, some "stray" tungsten (i.e., tungsten that does not deposit on the substrate) deposits on the showerhead and other chamber components. The stray tungsten film builds on the showerhead and may become a source of contamination in the chamber. Eventually, the stray tungsten may clog the holes in the showerhead that facilitate the passage of the precursor gas therethrough necessitating the showerhead be removed and cleaned or replaced.

To extend the interval in time between the routine maintenance of the showerhead, fluorine based chemistries are generally used to clean (i.e., etch away) the stray tungsten film. However, the use of fluorine, while advantageous for removing tungsten, reacts to form a layer of aluminum fluoride on the heated support that is commonly made of aluminum. The aluminum fluoride layer has a generally rough surface topography. The rough surface creates a leak path that impairs the vacuum used to chuck or hold the substrate to the heated support. Additionally, the aluminum fluoride layer is a potential source of particulate contamination.

Substrate supports fabricated from ceramic materials provide an improvement over aluminum supports due to ceramic's resistance to fluorine. However, ceramic support plates are difficult and expensive to fabricate. For example, the holes in support plate used to provide purge gas to the perimeter of the support are typically drilled from the perimeter of the support to a depth generally equal to the radius of the support. Drilling such a deep hole in ceramic is difficult. The tools used to make these holes are frequently broken during the fabrication (e.g., drilling) process. Broken tools disposed within the support must be removed or the support must be scrapped. These fabrication difficulties result in costly supports and an undesirable high scrap rate.

Therefore, there is a need in the art for an improved heated support for chemical vapor deposition processes.

SUMMARY OF INVENTION

One aspect of the present invention generally provides a support assembly for supporting a workpiece. In one embodiment, the support assembly includes a support plate supported by a second plate. The support plate has a first side and a second side. The second side of the support has a recess formed therein. The second plate includes a boss extending from the second plate which mates with the recess of the support plate.

In another embodiment, a support assembly includes a support plate and a second plate disposed proximate the support plate. The support plate has a first side and a second side. The second side of the support plate includes a plurality of sleeves protruding therefrom. The second plate has a plurality of holes disposed therein. Each sleeve of the support plate extends at least partially into a respective one of the holes.

In another embodiment, a support assembly includes a ceramic support plate, a second plate and a purge ring. The support plate is supported by the second plate. The ceramic support plate includes a flange that extends from the plate's perimeter. The purge ring is disposed on the flange and defines a channel between the ring and the support plate. The channel is adapted to flow a fluid adjacent a perimeter of the workpiece.

BRIEF DESCRIPTION OF DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAIL DESCRIPTION OF INVENTION

The present invention generally provides a substrate support assembly that is advantageous for the deposition of tungsten films. The invention is illustratively described below as a chemical vapor deposition system, such as a WxZ™ metal chemical vapor deposition (MCVD) system, available from Applied Materials, Inc., of Santa Clara, Calif. However, it should be understood that the invention has utility when depositing other films and in other system configurations such as physical vapor deposition systems, chemical vapor deposition systems and any other system in which supporting a substrate on a support plate is desired.

Figure 1:
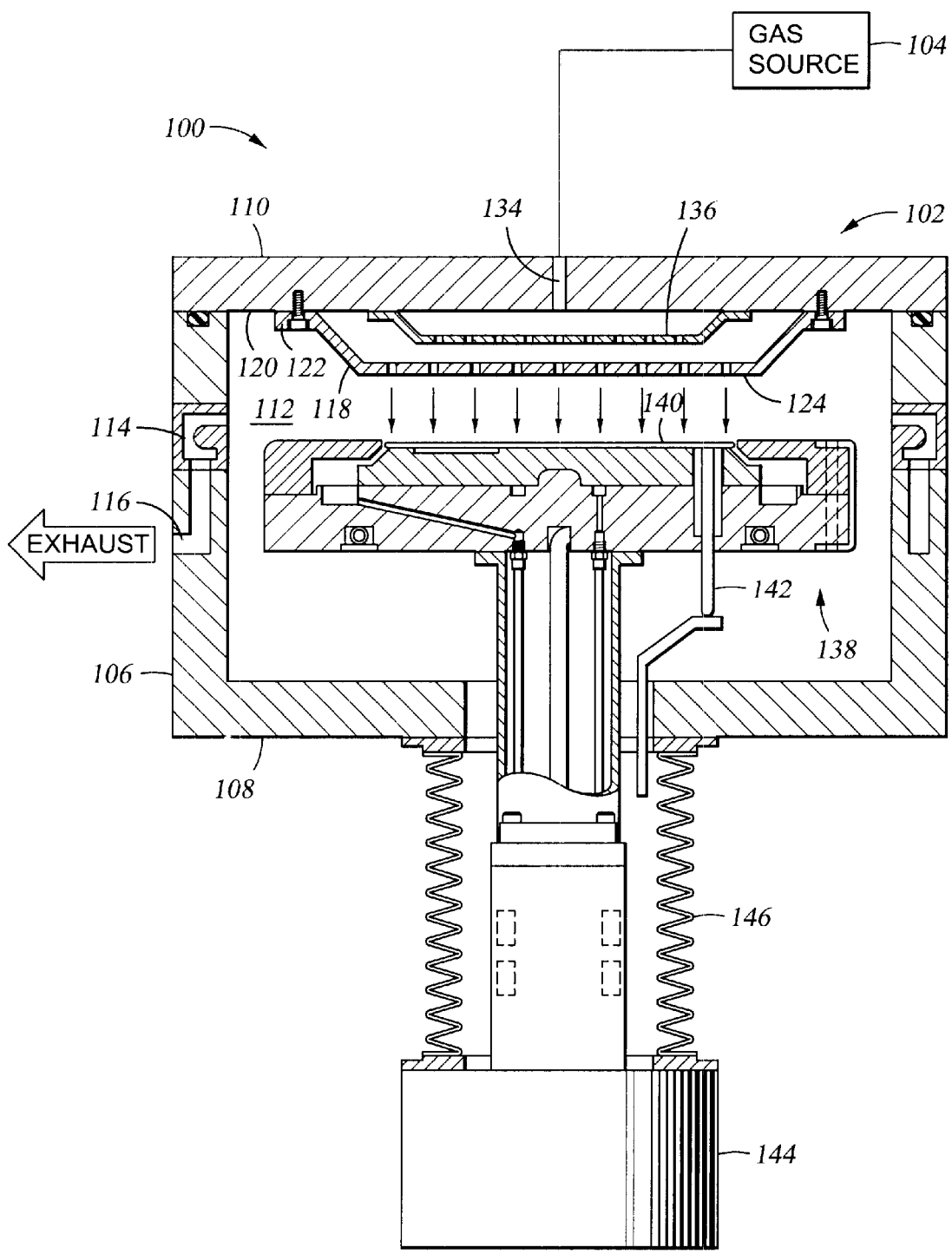
FIG. 1 depicts a schematic sectional view of one embodiment of a processing chamber of the present invention.

FIG. 1 is a cross sectional view of one embodiment of a chemical vapor deposition system 100. The system generally includes a chamber 102 coupled to a gas source 104. The chamber 102 has walls 106, a bottom 108 and a lid 110 that define a process volume 112. The walls 106 and bottom 108 are typically fabricated from a unitary block of aluminum. The chamber 100 contains a pumping ring 114 that couples the process volume 112 to an exhaust port 116 that includes various pumping components not shown.

The lid 110 is supported by the walls 106 and can be removed to service the chamber 102. The lid 110 is generally comprised of aluminum and may additionally contain heat transfer fluid channels for regulating the temperature of the lid 110 by flowing heat transfer fluid therethrough.

A showerhead 118 is coupled to an interior side 120 of the lid 110. The showerhead 118 is typically fabricated from aluminum. The showerhead 118 generally includes a perimeter mounting ring 122 that surrounds a "dish-shaped" center section 124. The center section 124 includes a perforated area 132 that allows for the passage of process and other gases therethrough.

A mixing block 134 is disposed in the lid 110. The mixing block 134 is coupled to the gas source 104 such that process and other gases may be introduced to the process volume 112 by passing through the mixing block 134 and showerhead 118. A blocker plate 136 disposed between the showerhead 118 and the mixing block 134 increases the uniform distribution of gases passing through the showerhead 118 into the chamber 102.

A support assembly 138 is disposed beneath the showerhead 118. The support assembly 138 supports a substrate 140 during processing. The support assembly 138 is typically accessed by the substrate 140 through a port (not shown) in walls 106. Generally, the support assembly 138 is coupled to a lift system 144 that moves the support assembly 138 between an elevated position as shown and a lowered position. Bellows 146 provides a vacuum seal between the process volume 112 and the atmosphere outside the chamber 102 while facilitating the movement of the support assembly 138.

A plurality of lift pins 142 are disposed through the support assembly 138. Generally, the lift pins 142 may be actuated to elevate the substrate 140 from the support to facilitate transfer into and out of the chamber 102. The mechanisms associated with actuating the pins lift 142 have been omitted from FIG. 1 for clarity.

Figure 2:
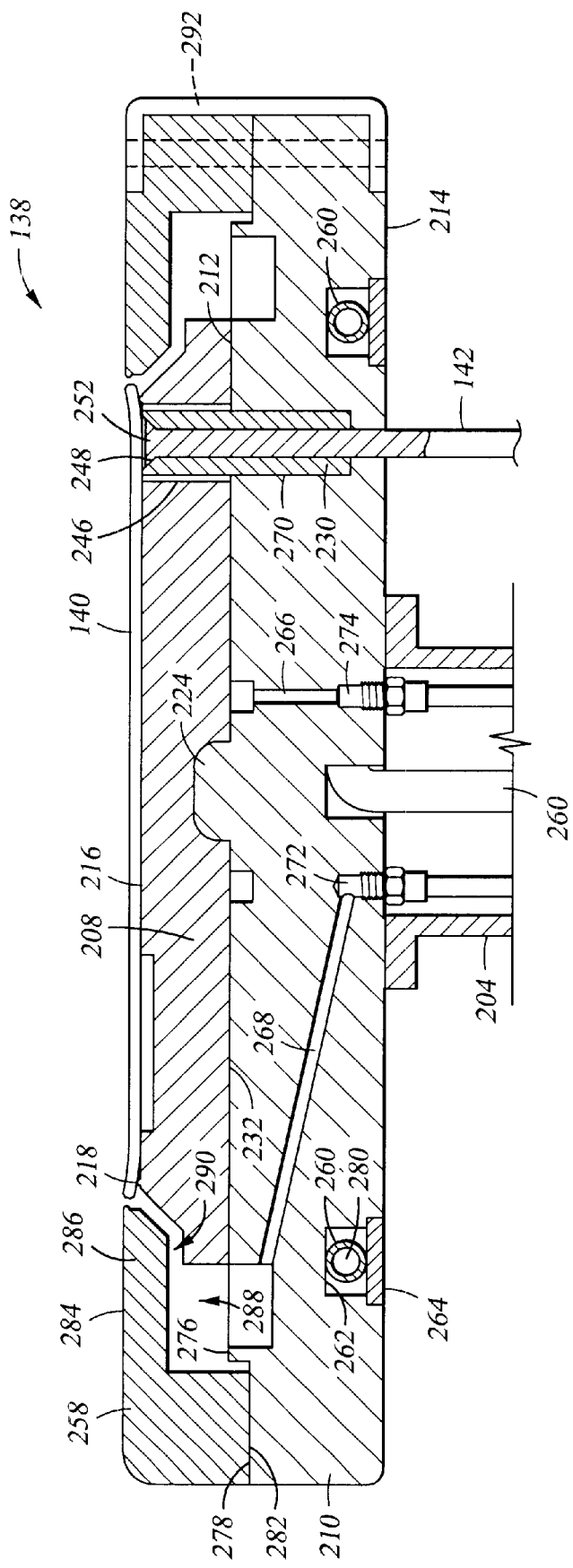
FIG. 2 depicts a sectional view of one embodiment of a support assembly.

FIG. 2 depicts the support assembly 138 in cross section. The scale of FIG. 2 has been exaggerated to clearly depict the features of the support assembly 138. The support assembly 138 generally includes a stem 204, a support plate 208 and a lower plate 210.

The support plate 208 is typically fabricated from a ceramic, such as aluminum nitride. Preferably, about 95 percent pure aluminum nitride is used to enhance the thermal conductivity of the support plate 208. In one embodiment, the support plate 208 is comprised of a unitary body of non-electrically conductive material (i.e., does not contain embedded metallic materials). Preferably, the support plate 208 is comprised of a single body of ceramic material, for example, a continuous, undivided body of aluminum nitride.

The support plate 208 generally includes a first surface 216 and a second surface 232. The first surface 216 supports the substrate 140 and includes a seal ring 218 and a plurality of lift pin passages 246. The seal ring 218 generally projects from the perimeter of the first surface 216. The seal ring 218 supports the substrate 140 at its perimeter and provides a seal therebetween to facilitate vacuum chucking of the substrate 140.

Figure 3:
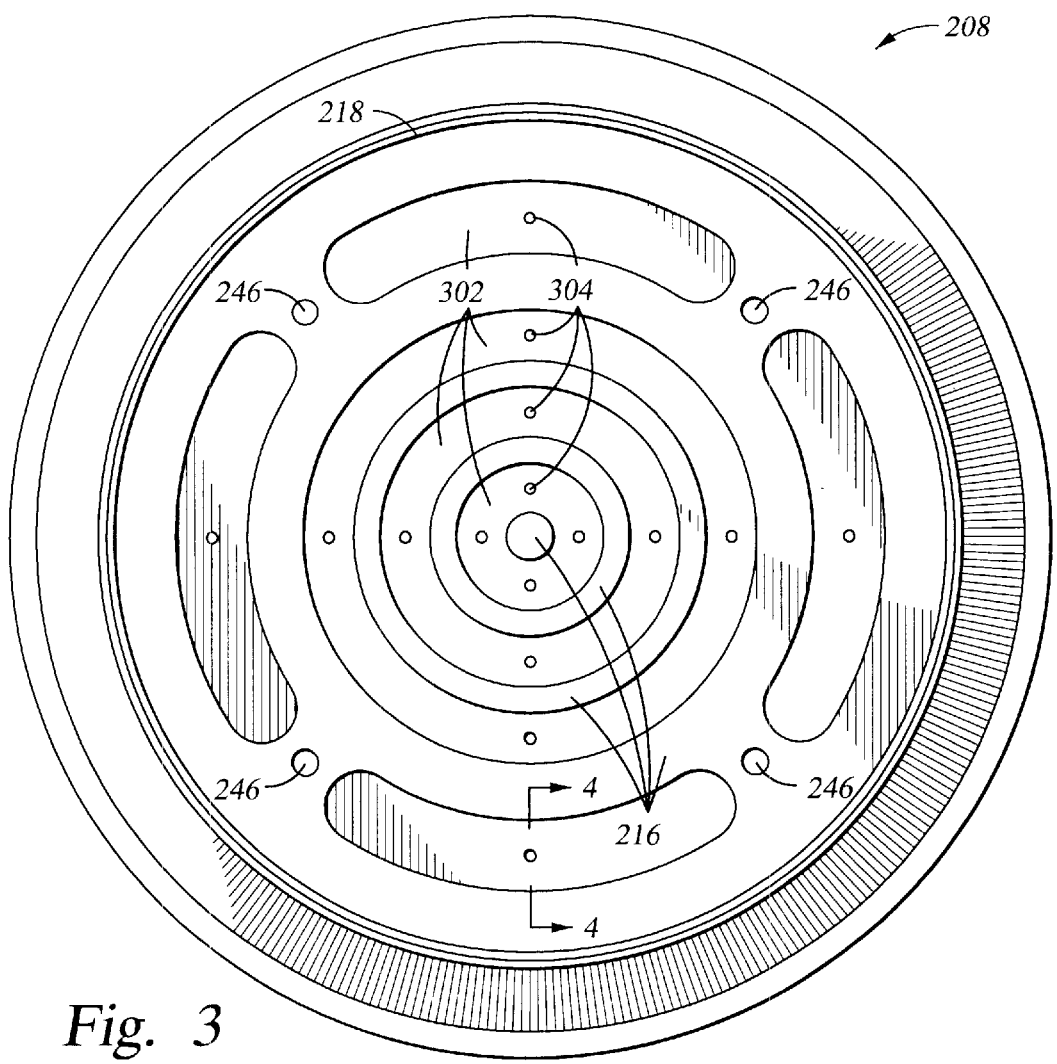
FIG. 3 depicts a top plan view of one embodiment of a support plate.
Figure 4:
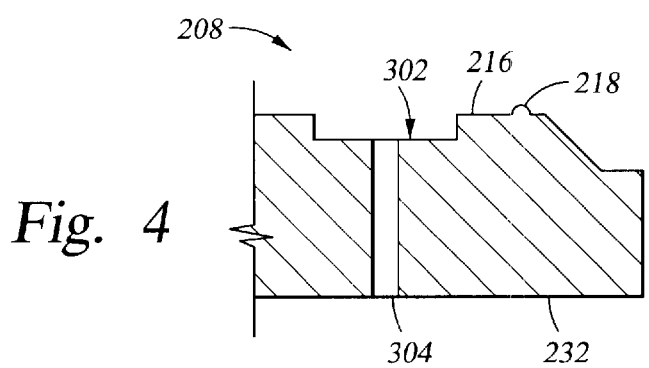
FIG. 4 depicts a sectional view of the support plate taken along section line 4—4 of FIG. 3.

FIGS. 3 and 4 depict a top plan view and a partial sectional view of one embodiment of the support plate 208. Generally, the support plate 208 includes at least one recessed area 302 formed in the top surface 216. In the illustrative embodiment, the first surface 216 has a plurality of recessed areas 302 formed therein. The recessed areas 302 provide a vacuum plenum between the first surface 216 and the substrate 140. The recessed areas 302 are coupled to a vacuum source (not shown) so that a vacuum applied to the recessed areas 302 secures the substrate 140 to the support plate 208 during processing.

In one embodiment, the recessed areas 302 include at least three concentric rings and four arcs disposed in a polar array outward of the concentric rings. Generally, the recessed areas 302 are about 0.001 to about 0.005 inches deep. Alternatively, the recessed areas 302 may comprise a single or multiple areas, and may be configured in different geometries.

At least one aperture 304 is disposed through the support plate 208 fluidly coupling at least one recessed area 302 to the vacuum source. Typically, at least one of the apertures 304 is fluidly coupled to at least one of the recessed areas 302. In one embodiment, the apertures 304 are orientated in a polar array that includes four groups of four apertures extending radially outwards from the center of the support plate 208.

The lift pin passages 246 are generally disposed in a polar array and pass through the support plate 208 between the first surface 216 and the second side 214. In one embodiment, four lift pin passages 246 are disposed through the support plate 208.

Returning to FIG. 2, the lower plate 210 is generally comprised of aluminum or other thermally conductive material. The plate has a first side 212 that is disposed adjacent to the support plate 208 and a second side 214 that is disposed adjacent to the stem 204. The first side 212 of the lower plate 210 generally includes a boss 224 extending therefrom. Typically, the boss 224 is circular in form and is centrally positioned on the lower plate 210. Alternatively, the boss 224 may have other geometry or be positioned in another location on the first side 212.

The lower plate 210 generally includes at least one heating element, such as a heat transfer coil 260. The coil 260 may be an electrical heater or a tube having a channel for circulating heat transfer fluid. Alternatively, the heating element may comprise a resistive or other heating means embedded in the lower plate 210. In one embodiment, the coil 260 is an electrical heater disposed in a metallic tube that regulates the temperature of the lower plate 210 and the support plate 208 and substrate 140 seated thereon. The coil 260 enables the support assembly 138 to heat the substrate 140 to a temperature up to about 300–550 degrees Celsius.

In one embodiment, the coil 260 is disposed in a groove 262 formed in the second side 214 of the lower plate 210.

The groove 262 is typically capped by a slug of material 264 sealed to the lower plate 210, for example, by brazing. The slug 264 substantially prevents the chamber atmosphere from entering the groove 262 and leaking into the stem 204 where the connections to the coil 260 are made. Optionally, the groove 262 and slug of material 264 may define a channel 280 for flowing heat transfer fluid therethrough.

The lower plate 210 additionally includes a vacuum passage 266, a purge passage 268 and a plurality of lift pin passages 270 extending therethrough. The lift pin passages 270 are generally disposed radially outward from the vacuum passage 266 and the purge passage 268. The lift pin passages 270 are configured to align with the lift pin passages 246 of the support plate 208.

Figure 5:
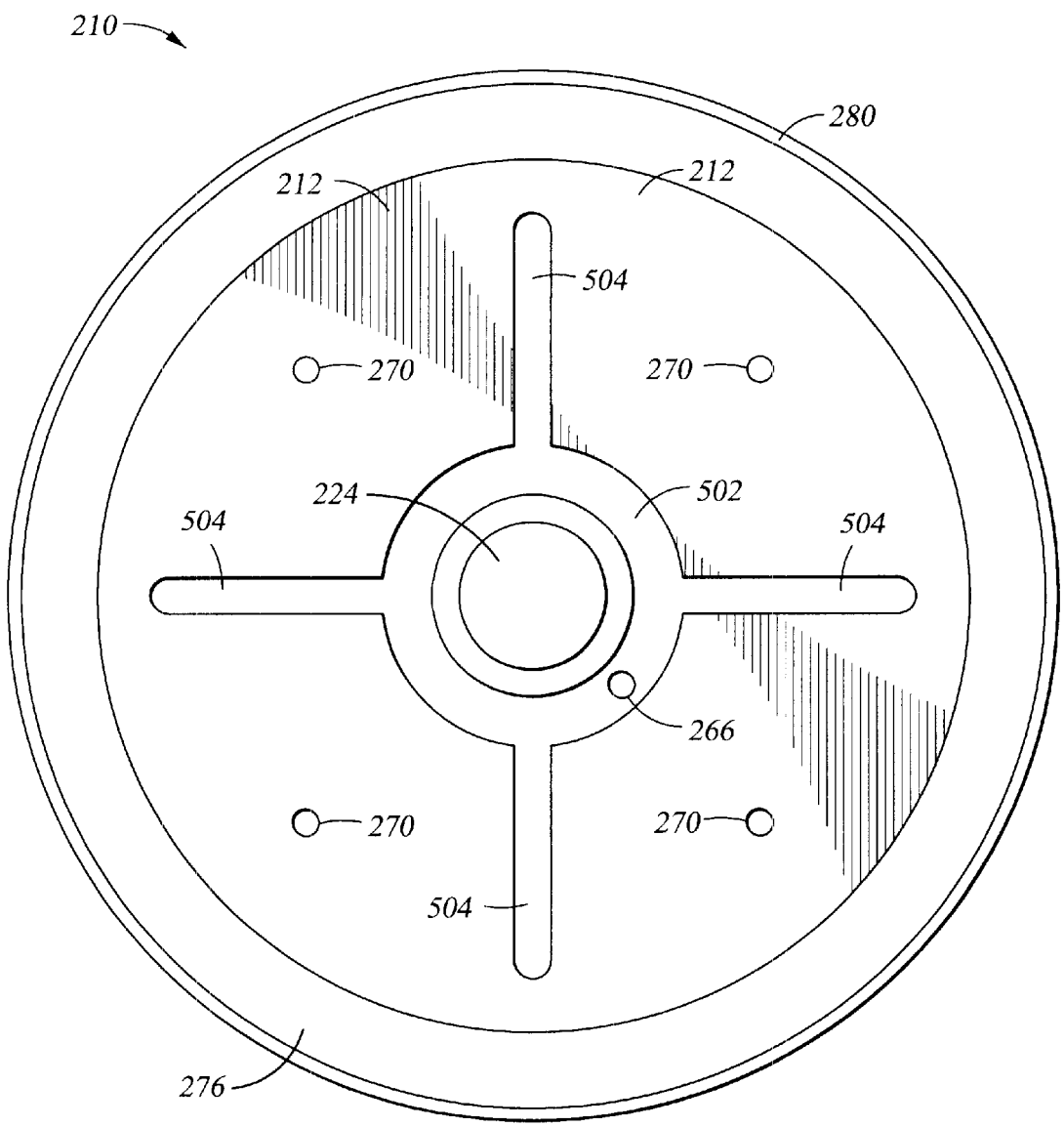
FIG. 5 depicts a top plan view of one embodiment of a lower plate.

Referring to a top plan view of the lower plate 210 depicted in FIG. 5, the vacuum passage 266 generally couples the vacuum source (not shown) to the recessed areas 302 of the support plate 208. The vacuum passage 266 is fluidly coupled to a circular channel 502 disposed on the first surface 212 of the lower plate 210. A plurality of secondary channels 504 are formed in the lower plate 210 and extend outwardly to align with the apertures 304 disposed in the support plate 208, thus allowing vacuum to be applied to the recessed areas 302 of the support plate 208. In one embodiment, four secondary channels 504 are disposed radially equidistant about the first side 212 of the support plate 208. Alternatively, the one or both of the channels 502 and 504 maybe disposed in the support plate 208, the lower plate 210 or both the first plate 208 and the lower plate 210.

Referring back to FIG. 2, the purge passage 268 is generally coupled to a gas supply (not shown) that provides a purge gas to the edge of the substrate 140. The purge passage 268 generally passes from the first side 212 (or edge) of the lower plate 210 and terminates at the second side 214 in a port 272. The port 272 is configured to accept a fitting of a supply line that is routed through the stem 204 to the purge gas source. Similarly, the vacuum passage 266 terminates in a port 274 that facilitates coupling to a fitting and a vacuum supply line.

The lower plate 210 has a stepped flange 276 that extends radially outward from the perimeter of the lower plate 210 co-planar with the second side 214. The flange 276 generally extends beyond the diameter of the support plate 208 and terminates in a step 278 that projects into the body of the lower plate 210.

A shadow ring 258 is supported outward of the first surface 216 of the support plate 208. The shadow ring 258 generally is annular in form and is typically comprised of ceramic such as aluminum nitride. The shadow ring 258 has a first side 282 and a second side 284. The first side 282 mates with and is supported by the step 278 of the flange 276 projecting from the lower plate 210. The step 278 concentrically locates the shadow ring 258 on the support assembly 138. The second side 284 has a lip 286 extending radially inward. The ring 258 and the lower plate 210 define a plenum 288 that receives the purge gas from purge passage 266. The plenum 288 may optionally extend into the lower plate 210. The purge gas flows about the perimeter of the substrate 140 through a gap 290 defined between the lip 286 and the support plate 208 that communicates with the plenum 288. The purge gas flowing from the plenum 288 and over the edge of the substrate prevents deposition at the substrate's edge. The plenum 288 provides for flow uniformity of the purge gas flow through the gap 290 while the gap 290 operates as a flow restrictor to regulate the flow therethrough. Generally, gravity retains the shadow ring 258 on the support assembly 138. Optionally, a clip assembly 292 may be utilized to retain the ring 258 on the support assembly 138. An example of a clip assembly 292 is disclosed U.S. patent Ser. No. 09/262,288 filed Feb. 15, 2000 by Yudovsky, and is hereby incorporated by reference in its entirety.

The support plate 208 is disposed on the lower plate 210 so that the second side 232 of the support plate 208 faces the first side 212 of the lower plate 210. Generally, no fasteners, clamps or adhesives are used to retain the support plate 208 on the lower plate 210 thus allowing the support plate 208 and lower plate 210 to thermally expand during processing without generating stresses due to differences in the rate of thermal expansion.

To locate the support plate 208 to the lower plate 210, the boss 224 projecting from the first side 212 of the lower plate 210 interfaces with a mating recess 228 disposed in the second side 232 of the support plate 208. Typically, the mating recess 228 is centrally disposed so that the thermal expansion of the support plate 208 and lower plate 210 is directed uniformly outward from the center of the support assembly 138. The touching surfaces 232 and 212 of the plates 208 and 210 are finished to minimize leakage of fluid therebetween and to promote thermal conductivity therebetween. Optionally, a substance or material layer may be disposed between the plates 208 and 210 to enhance sealing or head transfer, for example, a thermally conductive paste.

A plurality of lift pin guides 230 are disposed in the lift pin passages 246 and 270 of the support plate 208 and the lower plate 210, respectively. The passages 246 provide a clearance space for the guides 230 thus accommodating movement of the guides 230 due to thermal expansion. The guides 230 are generally fabricated from a ceramic material and include a counter sunk top portion 248 that allows a head 252 of the lift pin 142 to rest below a plane defined by the first surface 216 of the support plate 208. As the guides 230 are disposed through both the support plate 208 and the lower plate 210, the guides 230 prevent rotation of the support plate 208 relative to the lower plate 210.

The stem 204 generally is fabricated from aluminum. Optionally, other materials may be utilized, for example, a ceramic such as aluminum nitride. The stem 204 is generally tubular in cross section to allow for various fluid, vacuum and control lines to access the support plate 208 and the lower plate 210. The stem 204 is typically fastened by screws to the lower plate 210 at one end and to the lift system 144 at the other end. The bellows 146 is coupled between the stem 204 and chamber bottom 108 to isolate the process volume 112 from the outside of the chamber 102.

Figure 6:
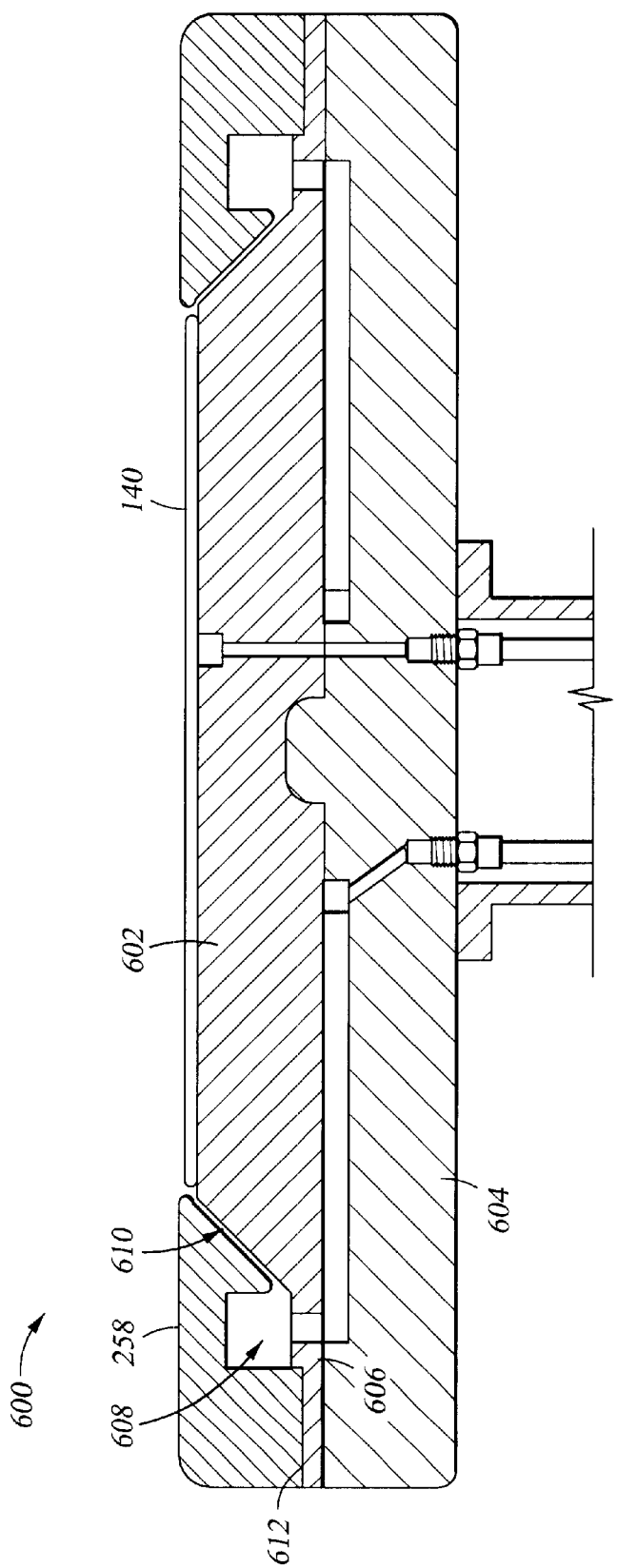
FIG. 6 depicts a sectional view of another embodiment of a support assembly.

FIG. 6 depicts another embodiment of a support assembly 600. The support assembly is substantially similar to the support assembly 138 described above except that a support plate 602 and lower plate 604 have different vacuum and purge passageways. Generally, the support plate 602 is configured to support the shadow ring 258 thereon. In one embodiment, the support plate 602 includes a flange 606 that extends over the lower plate 604. The flange 606 generally includes a step 612 that receives the lower portion of the shadow ring 258 to concentrically locate the ring 258 in relation to the support assembly 600. The shadow ring 258 and support plate 602 define a plenum 608 and gap 610 therebetween that allow uniform delivery of purge gas around the perimeter of the substrate as described above.

Figure 7:
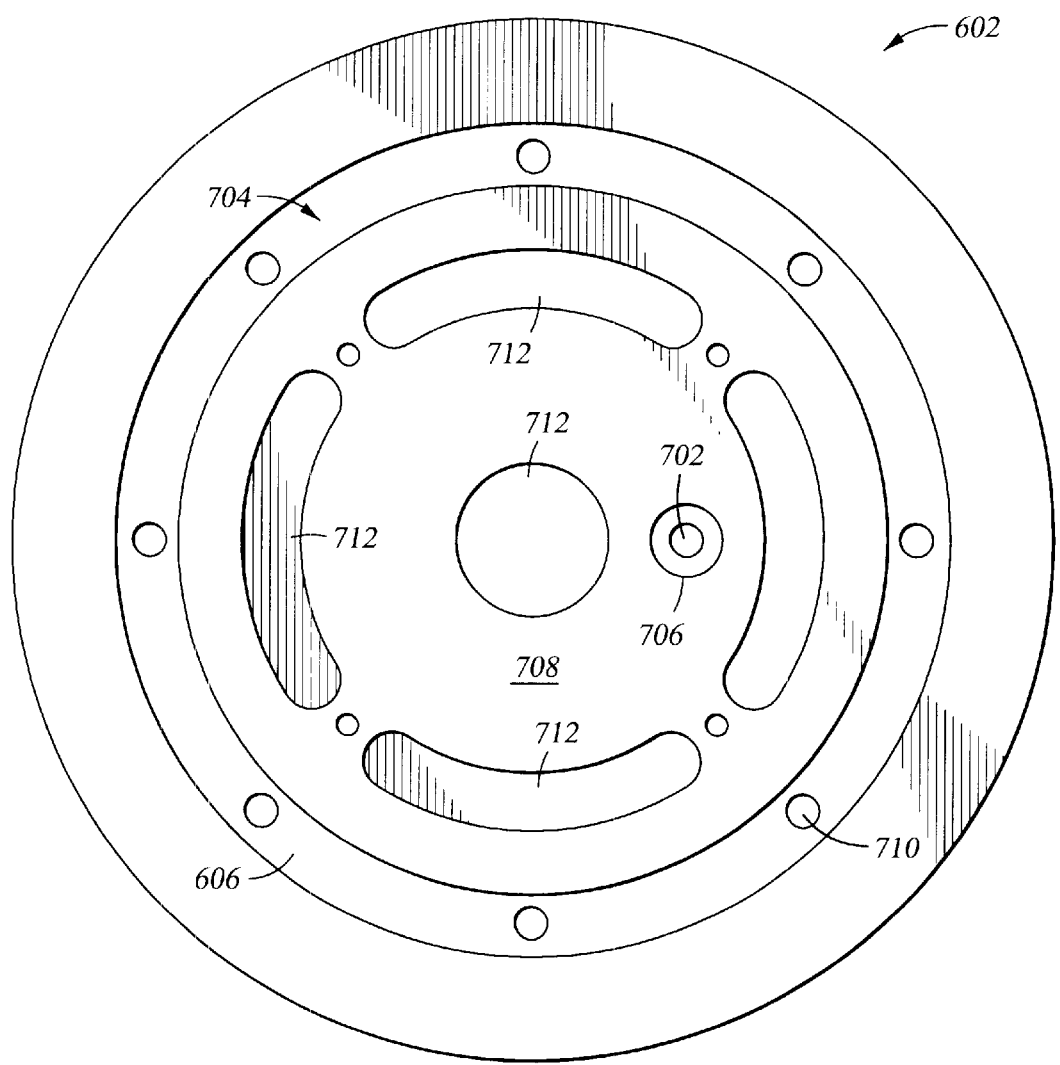
FIG. 7 depicts a top plan view of another embodiment of a support plate.

Referring to the sectional view of the support plate 602 of FIG. 7, the support plate 602 generally includes a vacuum channel 702. The channel 702 couples the vacuum source to a support surface 704 of the support plate 602. The channel 702 may exit the support surface 704 through an enlarged port 706 (i.e., the port 706 has a greater sectional area than the channel 702). The enlarged port 706 reduces the pressure differential created by fluids entering the port 706, thus preventing local cooling of the area of the substrate positioned above the port 706 and consequently enhancing deposition uniformity on the substrate.

The support surface 704 may include one or more recessed areas 708 to enhance the vacuum chucking of the substrate. The recessed areas 708 may have the channel 702 connected thereto, or the channel 702 (or port 706) may by disposed on the support surface 704 adjacent to the recessed areas 708. In one embodiment, the recessed areas 708 comprises a stepped surface having a deeper, a central portion, and an intermediate depth, a middle portion, and a shallow outer portion. The enlarged port 706 is disposed in the stepped surface (e.g., recess area 708). An example of a support assembly having such an enlarged port and stepped surface is described in the previously incorporated U.S. patent application Ser. No. 09/596,854. Alternatively, a single recessed area 708 may comprise a patterned portion of the support surface 704, thus defining a plurality of support "islands" 712 in the support surface 704. The support islands 712 minimize the distances across the surface of the substrate, thus maintaining the substrate in a level, planar orientation.

The flange 606 additionally includes a plurality of apertures 710 passing therethrough. The apertures 710 are generally orientated in the flange 606 to align with the plenum 608. The total area of the apertures 710 is selected as not to provide a controlling flow restriction to the purge gas passing therethrough. In one embodiment, the apertures 710 comprise eight apertures 710 disposed in a polar array through the flange 606.

Figure 8:
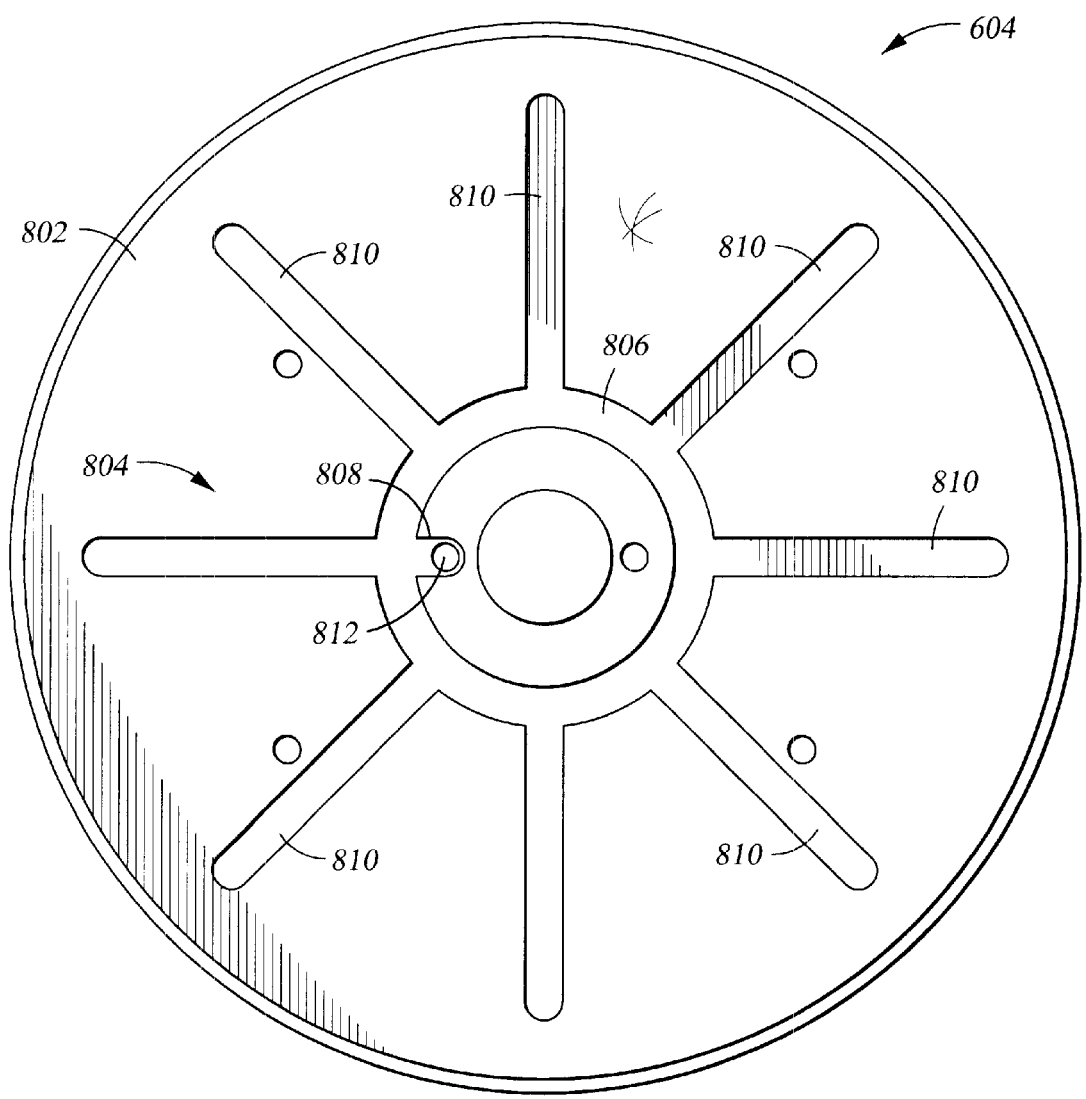
FIG. 8 depicts a top plan view of one embodiment of a lower plate.

FIG. 8 depicts a top plan view a first side 802 of the lower plate 604. Generally, a channel 804 is formed in the lower plate 604. The channel 804 provides a passage for purge gas to the plenum 608 from a passage 812 disposed through the lower plate 604. In one embodiment, the channel 804 generally a circular channel 806, a primary supply channel 808, and a plurality of secondary supply channels 810. The primary supply channel 808 is coupled to the passage 812 and extends outward to the circular channel 806. Each of the secondary supply channels 810 extends outward from the circular channel 806 to a position below a respective aperture 710 in the support plate 602. Purge gas, supply from the purge gas source through the stem, passes through the passage 812 and is distributed from by the channel 804 to the plenum 608 through the apertures 710 in the flange 606. Generally, the configuration of channel 804 promotes uniform flow through the secondary channels 810. This may be accomplished by varying the lengths and cross-sectional area of the different portions of the channels 804. Although the channel 804 is illustrated in the lower plate 604, the channel 804 may be disposed at least partially or completely disposed in the support plate 602.

Figure 9:
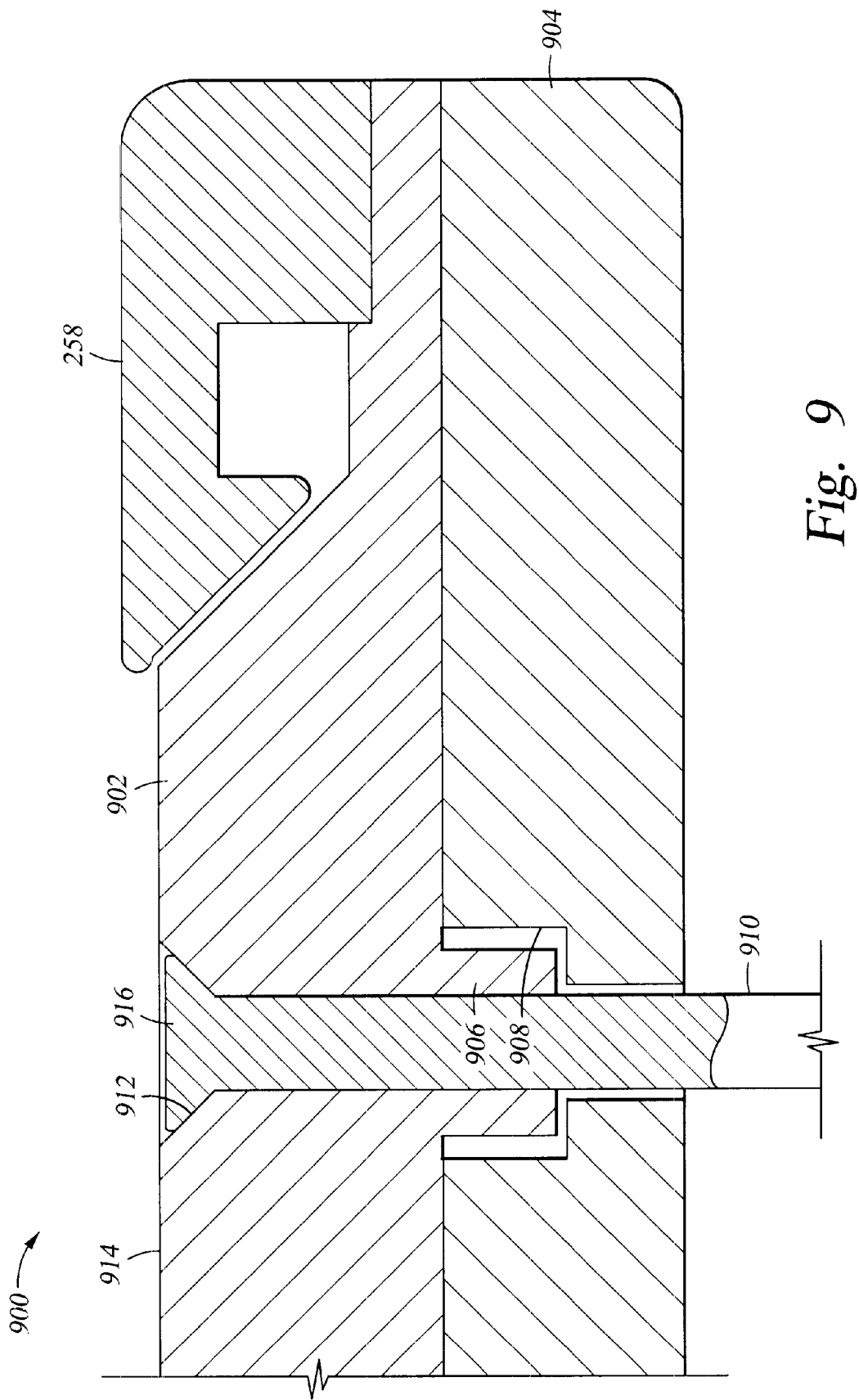
FIG. 9 depicts a partial sectional view of another embodiment of a support assembly.

FIG. 9 depicts a partial sectional view of another embodiment of a support assembly 900. Generally, the support assembly 900 is substantially similar to the support assembly 138 described above except wherein a support plate 902 of the support assembly 900 has a plurality of sleeves 906 extending therefrom. Generally, each sleeve 906 have a hole 908 defined therein that accommodates a lift pin 910. The sleeve 906 and support plate 902 generally comprise a single structure (i.e., is made of a singular piece of material). The hole 908 generally includes a chamfered edge 912 at a support surface 914 of the support plate 902 that allows for a head 916 of the lift pin 910 to seat thereon. Thus, as the lift pin 910 sit directly on the support plate 902, leakage of fluids and/or vacuum proximate the lift pins 910 is substantially reduced by eliminating the need for pin guides the component tolerances required by their use.

The lower plate 904 generally includes a plurality of lift pin passages 914 to accept the lift pins disposed therein. Each passage 914 includes a concentric counter bore 916 that mates with the sleeve 906 extending from the support plate 902. As the sleeves 906 interface with the counter bores 916 in a polar array, both the lateral and rotation movement between the support plate 902 and the lower plate 904 are retrained. The support assembly 900 configured as described may optionally include a central locating boss and mating recess as described in reference to the support assembly 138.

The operation of the support assembly 138 is best described in reference to FIGS. 1 and 2. In operation, the semiconductor substrate 140 is secured to the support assembly 138 by providing a vacuum therebetween. The temperature of the substrate 140 is elevated to a predetermined process temperature primarily by providing power to the coil 260. During the deposition process, the substrate 140 is heated to a steady state temperature. Using thermal control of both the lid 110 and the support assembly 138, the substrate 140 is maintained at a temperature of 300–550 degrees Celsius.

Gaseous components, which in one embodiment may include silane and tungsten hexafluoride, are supplied from a gas panel to the process chamber through mixing block 134 and showerhead 118 to form a gaseous mixture. The gaseous mixture reacts to form a layer of tungsten on the substrate 140. To prevent deposition at the substrate's edge and possible adherence of substrate 140 to the support assembly 138, purge gas is flowed into the plenum 288 from the passage 268, and distributed through the gap 290 between the shadow ring 258 and the support plate 208 to the perimeter of the substrate 140.

Although the teachings of the present invention that have been shown and described in detail herein, those skilled in the art can readily devise other varied embodiments that still incorporate the teachings and do not depart from the scope and spirit of the invention.

What is claimed is:

1. A support assembly for supporting a workpiece comprising:

a support plate having a first side and a second side, the second side having a recess formed therein;

a plurality of sleeves projecting from the second side of the support plate, the sleeves and support plate comprising a single body of material; and a plurality of holes passing through the sleeve coupling the first side and the second side of the support plate, each hole adapted to receive a lift pin;

a second plate disposed proximate the second side of the support plate, wherein the support plate is not fastened to the second plate during operation of the support assembly; and a boss extending from the second plate and mating with the recess of the support plate.

2. The support assembly of claim 1, wherein the second plate further comprises a plurality of holes, each hole having a portion of the sleeve extending thereinto.

3. The support assembly of claim 1, wherein the first side of the support plate further comprises one or more recessed areas.

4. The support assembly of claim 3, wherein the support plate further comprises one or more apertures fluidly coupled to the recessed areas.

5. The support assembly of claim 4, wherein the second plate further comprises a port fluidly coupled to the apertures disposed in the support plate.

6. The support assembly of claim 5, wherein the second plate further comprises:
a plurality of radially extending channels fluidly coupled between the port disposed in the second plate and the apertures disposed in the support plate.

7. The support assembly of claim 1, wherein the second plate is comprised of aluminum.

8. The support assembly of claim 1, wherein the support plate is comprised of ceramic.

9. The support assembly of claim 1, wherein the support plate is comprised of aluminum nitride.

10. The support assembly of claim 1, wherein the support plate further comprises a circumscribing flange.

11. The support assembly of claim 10, further comprising:
a purge ring disposed on the flange, the purge ring adapted to direct a fluid adjacent a perimeter of the workpiece.

12. The support assembly of claim 11, wherein the flange further comprises one or more holes disposed therethrough and fluidly coupled to a channel defined between the purge ring and the support plate.

13. The support assembly of claim 12, wherein the second plate further comprises one or more ports disposed therein and fluidly coupled to the channel.

14. The support assembly of claim 13, wherein the second plate further comprises a plurality of radially extending channels formed in a surface of the second plate, the channels fluidly coupled between the port disposed in the second plate and the apertures disposed in the support plate.

15. The support assembly of claim 1, wherein the second plate further comprises a resistive heater disposed therein.

16. The support assembly of claim 1, further comprising a heating element disposed adjacent to or within the support plate.

17. A support assembly for supporting a workpiece comprising;
a support plate having a first side and a second side, the second side having a plurality of sleeves extending therefrom, the sleeve and support plate comprising a single body of material; and
a second plate disposed proximate the second side of the support plate, the second plate having a plurality of holes disposed therein, each sleeve extending at least partially into a respective one of the holes, each hole adapted to receive a lift pin.

18. The support assembly of claim 17, wherein the second plate further comprises a boss extending from the second plate and mating with a recess disposed in the support plate.

19. The support assembly of claim 17, wherein the support plate includes a flange extending from the support plate's perimeter.

20. The support assembly of claim 19, further comprising:
a purge ring disposed on the flange, the purge ring adapted to direct a fluid adjacent a perimeter of the workpiece.

21. The support assembly of claim 20, wherein the flange further comprises one or more holes disposed therethrough and fluidly coupled to a channel defined between the purge ring and the support plate.

22. The support assembly of claim 21, wherein the second plate further comprises one or more ports disposed therein and fluidly coupled to the channel.

23. The support assembly of claim 22, wherein the second plate further comprises a plurality of radially extending channels formed in a surface of the second plate, the channels coupled between the port then the apertures disposed in the support plate.

24. The support assembly of claim 17, further comprising at least one lift pin disposed through one sleeve and extending through side second plate.

25. The support assembly of claim 17, wherein the support plate further comprises:
a plurality of recesses disposed in the first side; and
a plurality of holes disposed through the ceramic second plate, each of the recesses having at least one of the holes fluidly coupled thereto.

26. The support assembly of claim 25, wherein the second plate further comprises:
a port disposed through the second plate; and
a plurality of channels radially disposed in a surface of the second plate, the channels fluidly coupling the port and the holes disposed in the support plate.

27. A support assembly for supporting a workpiece comprising:
a ceramic support plate having a flange, a first side and a second side, the flange extending from a perimeter of the support plate;
a plurality of recesses formed in the first side of the support plate;
one or more apertures coupling each recess to the second side of the support plate;
a plurality of sleeves protruding from the second side of the support plate, the sleeves and support plate comprises a single body of material; and
a plurality of holes passing through the sleeve coupling the first side and the second side of the support plate, each hole adapted to receive a lift pin;
a second plate proximate the second side of the support plate and having a vacuum port disposed therethrough;
at least one radial channel formed between the support plate and second plate coupling the vacuum port and the apertures; and
a purge ring disposed on the flange and defining a channel between the ring and the support plate, the channel adapted to flow a fluid adjacent a perimeter of the workpiece.

28. The support assembly of claim 27, wherein the second plate further comprises a plurality of holes, each hole having a portion of the sleeve extending thereinto.

29. The support assembly of claim 27, wherein the first side of the support plate further comprises one or more recessed areas.

30. The support assembly of claim 29, wherein the support plate further comprises one or more apertures fluidly coupled to the recessed areas.

31. The support assembly of claim 30, wherein the second plate further comprises a port fluidly coupled to the apertures disposed in the support plate.

32. The support assembly of claim 29, wherein the second plate further comprises a plurality of radially extending channels coupled between the port in the second plate and the apertures disposed in the support plate.

33. The support assembly of claim 27, wherein the second plate is comprised of aluminum.

34. The support assembly of claim 27, wherein the support plate is comprised of aluminum nitride.

35. The support assembly of claim 27, wherein the support plate further comprises a circumscribing flange.

36. The support assembly of claim 27, wherein the flange further comprises one or more holes disposed therethrough and fluidly coupled to a channel defined between the purge ring and the support plate.

37. The support assembly of claim 36, wherein the second plate further comprises one or more ports disposed therein and fluidly coupled to the channel.

38. The support assembly of claim 37, wherein the second plate further comprises a plurality of radially extending channels formed in a surface of the second plate, the channels coupled between the port disposed in the second plate and the apertures disposed in the support plate.

39. The support assembly of claim 27, wherein the second plate further comprises a resistive heater disposed therein.

40. The support assembly of claim 27, further comprising a heating element disposed adjacent to or within the second plate.

41. The support assembly of claim 27, wherein the second side of the ceramic support plate further comprises:

a recess formed therein; and the second plate further comprises:
a boss extending from the second plate and mating with the recess of the support plate.

42. A support assembly for supporting a workpiece comprising:

a ceramic support plate having a flange, a first side and a second side, the flange extending from a perimeter of the flange; the second side having a recess formed therein;

a plurality of sleeves protruding from the second side of the support plate, the sleeves and support plate being a singular structure;

a metallic conductive plate disposed against the second side of the support plate and having a plurality of bores formed therein, each one of the bores mating respectively with one of sleeves of the support plate;

a boss extending from the metallic plate and mating with the recess of the support plate; and a purge ring disposed on the flange and defining a channel between the ring and the support plate, the channel adapted to flow a fluid adjacent a perimeter of the workpiece.

* * * * *